(12) United States Patent
Wahlroos et al.

(10) Patent No.: US 12,301,131 B2
(45) Date of Patent: May 13, 2025

(54) METHOD AND APPARATUS FOR CONTROLLING NEUTRAL POINT VOLTAGE OF THREE-PHASE RESONANT-EARTHED ELECTRIC NETWORK

(71) Applicant: ABB Schweiz AG, Baden (CH)

(72) Inventors: Ari Wahlroos, Vaasa (FI); Janne Altonen, Tampere (FI); Janne Leminen, Tampere (FI)

(73) Assignee: ABB Schweiz AG, Baden (CH)

( * ) Notice: Subject to any disclaimer, the term of this patent is extended or adjusted under 35 U.S.C. 154(b) by 171 days.

(21) Appl. No.: 18/163,370

(22) Filed: Feb. 2, 2023

(65) Prior Publication Data
US 2023/0318484 A1 Oct. 5, 2023

(30) Foreign Application Priority Data
Feb. 4, 2022 (EP) .................................... 22155214

(51) Int. Cl.
*H02H 9/08* (2006.01)
*H02M 1/12* (2006.01)
*H02M 7/487* (2007.01)

(52) U.S. Cl.
CPC ............... *H02M 7/487* (2013.01); *H02H 9/08* (2013.01); *H02M 1/12* (2013.01)

(58) Field of Classification Search
CPC ........... H02H 9/08; H02M 1/12; H02M 7/487
See application file for complete search history.

(56) References Cited

U.S. PATENT DOCUMENTS

| 1,537,371 | A | 5/1925 | Petersen |
| 2020/0083702 | A1* | 3/2020 | Zeng ....................... H02H 9/002 |
| 2020/0150191 | A1 | 5/2020 | Yang |

FOREIGN PATENT DOCUMENTS

| CN | 108964001 A | * | 12/2018 | ............... H02H 9/08 |
| EP | 3657620 A1 | * | 5/2020 | ............... H02H 9/08 |

OTHER PUBLICATIONS

Euopean Search Report: Application No. EP22155214; Completed: Jun. 29, 2022; 2 Pages.
Rorabaugh, Jesse, et al.; "Resonant Grounded Isolation Transformers to Prevent Ignitions From Powerline Faults"; IEEE Transactions on Power Delivery; IEEE Service Canter, New York, NY; vol. 36, No. 4; 10 Pages.

* cited by examiner

Primary Examiner — Harry R Behm
(74) Attorney, Agent, or Firm — Whitmyer IP Group LLC (57) ABSTRACT

A method and apparatus for controlling a neutral point voltage of a three-phase resonant-earthed electric network, the apparatus including determining means configured to determine a target value for the neutral point voltage of the three-phase resonant-earthed electric network, calculating means configured to calculate at least one phase-specific control admittance or a neutral point specific control admittance required for controlling the neutral point voltage of the three-phase resonant-earthed electric network from a prevailing value to the determined target value, and admittance means configured to add the calculated at least one phase-specific control admittance between a ground and a respective phase of the three-phase resonant-earthed electric network or the calculated neutral point specific control admittance between the ground and a neutral point of the three-phase resonant-earthed electric network.

21 Claims, 4 Drawing Sheets

METHOD AND APPARATUS FOR CONTROLLING NEUTRAL POINT VOLTAGE OF THREE-PHASE RESONANT-EARTHED ELECTRIC NETWORK

TECHNICAL FIELD

The present invention relates to a method and an apparatus for controlling a neutral point voltage of a three-phase resonant-earthed electric network.

BACKGROUND

An arc suppression device can be used for compensating a fault current caused by a single-phase-to-earth fault. An example of an arc suppression device is an Arc Suppression Coil, ASC, which is a passive inductive device that is connected between a neutral point of an electric system and earth to limit the capacitive earth-fault current flowing, when a single-phase-to-earth fault occurs in the system. The ASC was originally developed by Waldemar Petersen and may therefore also be referred to as the Petersen Coil. This kind of system neutral point earthing is called as the resonant earthing. The resonant earthing is a commonly used earthing practice in medium voltage networks, for example, and it has been used in several countries for many decades with good operational experiences. An example of the ASC is disclosed in U.S. Pat. No. 1,537,371.

The idea of the resonant earthing is to form a parallel resonance circuit with the network admittances. The resulting resonance circuit is essentially an RLC-parallel resonance circuit, where R is essentially due to network shunt losses (e.g. losses of conductors and coils), L is essentially due to the inductance of the arc suppression device and C is essentially due to the phase-to-earth capacitance of the conductors in the network. When the reactance value of $\omega \cdot L$ equals the value of $1/(\omega \cdot C)$, the network is at resonance. At resonance the circuit will have maximum impedance defined by the value of R. When the circuit impedance has its maximum value, an earth fault current resulting from an earth fault in the network will have a minimum value. Parallel RLC-circuit may also be called as a current resonance circuit. A purpose of the resonant earthing may thus be to match, either essentially completely or at least partially, the inductance of the arc suppression device to the total phase-to-earth capacitance formed by the network conductors. This way the magnitude of the earth-fault current at the fault location may be limited below the level of self-extinguishment, which can suppress transient earth faults without a feeder tripping, for example. Also, touch and hazard voltages may be limited with the decreased fault current value, which can also limit the danger to public and property, and improves safety to personnel, for instance.

Due to the characteristics of the parallel resonance RLC circuit, any imbalance in the network phase admittances can create a 'standing' voltage between a neutral point of the network and earth (called as the neutral point voltage Uo) during the network healthy state. The larger is the admittance imbalance, the higher Uo will be. A high value of Uo may result in making phase voltages unsymmetrical. The maximum healthy-state value of Uo is always reached when the arc suppression device is tuned to resonance. As the earth-fault current compensation effect of the arc suppression device is highest at resonance, utilities may prefer to operate their networks close to the resonance point of the system, for instance.

In a practical three-phase resonant-earthed (i.e. compensated) electric network, the admittance imbalance may vary and may be mainly dependent on used conductors: cables or over-headlines, for example.

In case of networks, where conductors are dominantly three-phase underground cables, the resulting admittance imbalance may be typically very small (due to the symmetry of phase-to-earth capacitances of three-phase cables) resulting in a very small healthy-state Uo. Small value of Uo may be advantageous from an earth-fault detection perspective, as it allows application of sensitive earth-fault detection settings (Uo, Io thresholds), for example. A possible drawback of a too low Uo value, may be that some coil tuners may not be able to complete the tuning process (i.e. to calculate the magnitude of the network capacitance) as it may require a measurable variation of Uo as a function of coil tuning, for instance. As the share of three-phase cables is constantly increasing in modern distribution systems, network operators may need to evaluate the admittance imbalance of their networks and the technology and methods used in coil tuning, for example. Coil tuning methods applicable for networks with a small admittance unbalance may involve power electronics-based methods (current is injected into system neutral point to raise Uo), which can increase cost and complexity compared with traditional coil tuning methods, for instance.

In case of networks, where conductors are dominantly overhead lines, the resulting admittance imbalance may depend on e.g. used tower geometry (which may vary between line sections), but it is typically significantly higher than with cables. In case of a high admittance imbalance, the resulting healthy-state Uo voltage may reach a value, which may limit the performance of earth fault detection, for example. In extreme cases, high admittance unbalance may even result in severe phase over-voltages as the phase voltages are dependent on the neutral point voltage. Too high admittance unbalance may not allow a practical implementation of the resonant earthing and may require admittance imbalance compensation. This may be especially valid in networks with 1-phase or 2-phase line sections, for example. It should also be noted that an absolute value of the phase-to-earth capacitance may be significantly higher in cables than overhead lines, even up to hundred times, for instance.

In practical networks with a varying share of cables and overhead lines, the value of admittance unbalance may vary depending on the switching status of feeders, for example. The admittance imbalance and the maximum healthy-state Uo value may typically be not well known, neither the network parameters that affect to these values.

Thus, a problem with such resonant-earthed electric networks is that the level of the neutral point voltage of the network may be undesirable or generally nonoptimal.

SUMMARY

It is thus an object of the present invention to provide a method and an apparatus for implementing the method so as to overcome the above problem or at least to alleviate the problem. The object of the invention is achieved by a method and an apparatus which are characterized by what is stated in the independent claims. The preferred embodiments of the invention are disclosed in the dependent claims.

The invention is based on the idea of determining a target value for the neutral point voltage of the three-phase resonant-earthed electric network, calculating at least one phase-specific control admittance or a neutral point specific control admittance required for controlling the neutral point voltage from a prevailing value to the determined target value, and adding the calculated at least one phase-specific control admittance between a ground and a respective phase of the three-phase resonant-earthed electric network or the calculated neutral point specific control admittance between the ground and a neutral point of the three-phase resonant-earthed electric network.

An advantage provided by the solution is that a desirable level of the neutral point voltage of the three-phase resonant-earthed electric network can be obtained regardless of a prevailing admittance unbalance level in the network.

BRIEF DESCRIPTION OF THE DRAWINGS

In the following the invention will be described in greater detail by means of preferred embodiments with reference to the attached [accompanying] drawings, in which.

DETAILED DESCRIPTION

The following embodiments are exemplary. Although the description may refer to "an", "one", or "some" embodiment(s) in several locations, this does not necessarily mean that each such reference is to the same embodiment(s), or that the feature only applies to a single embodiment, for example. Single features of different embodiments may also be combined to provide other embodiments. Generally, all terms and expressions used should be interpreted broadly and they are intended to illustrate, not to restrict, the embodiments. The figures only show components necessary for understanding the various embodiments. The number and/or shape of the various elements, and generally their implementation, could vary from the examples shown in the figures.

The application of the various embodiments described herein is not limited to any specific system, but it can be used in connection with various three-phase electric networks with a compensated neutral, also known as resonant earthed networks or compensated networks, where compensation of the fault current may be achieved by installing one or more arc suppression devices (e.g. Petersen coils) into neutral point(s) of the network. The electric network, in which the various embodiments may be implemented, can be an electric power transmission or distribution network or a portion or component thereof, for example, and may comprise several electric lines or sections. The electric network may have a radial configuration supplied from one point thereof or a loop configuration comprising one or more loops and supplied from two or more points, for instance. Moreover, the use of the various embodiments is not limited to systems employing 50 Hz or 60 Hz fundamental frequencies or to any specific voltage level.

Figure 1:
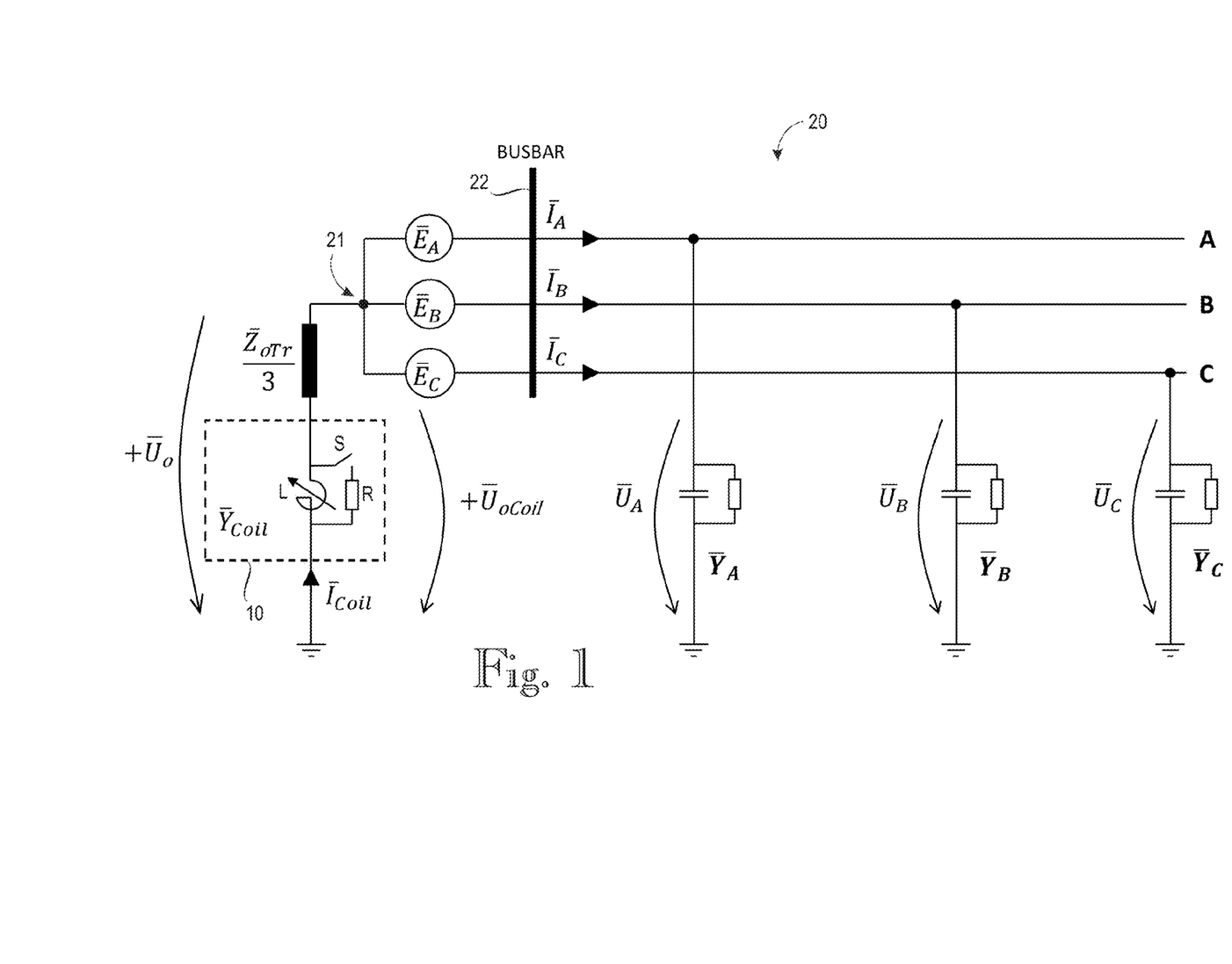
FIG. 1 shows an example of a three-phase electric network according to an embodiment.

FIG. 1 is diagram illustrating a simplified equivalent circuit of a three-phase electric network 20 in which the various embodiments can be applied. The exemplary three-phase network 20 with phases A, B and C may be a medium voltage (e.g. 20 kV) distribution network fed through a substation comprising a source $\overline{E}_A$, $\overline{E}_B$, $\overline{E}_C$, such as a transformer or generally a feeding point of the electric network 20, and a feeding busbar 22 connected to one or more electric line outlets, e.g. feeders. Respective phase currents of phases A, B and C are $\overline{I}_A$, $\overline{I}_B$, and $\overline{I}_C$, with a positive current direction from the feeding point towards line as indicated by the arrows in the figure, and respective phase voltages are $\overline{U}_A$, $\overline{U}_B$, and $\overline{U}_C$. FIG. 1 further illustrates an arc suppression device 10, which is connected between a neutral point 21 of the three-phase electric network 20 and earth. The arc suppression device 10 can be connected to the neutral point 21 of the network 20 via an earthing transformer or any other suitable arrangement, for example. An admittance of the arc suppression device 10 is $\overline{Y}_{Coil}$ and the exemplary arc suppression device 10 as illustrated comprises one adjustable coil L and a resistor R which can be connected in parallel to the coil L with an associated switch S. The arc suppression device 10 could comprise more than one adjustable and/or non-adjustable coil, and more than one resistor, for instance. $\overline{I}_{Coil}$ is the current flowing through the arc suppression device 10. The arc suppression device 10 may further include a controller for controlling, e.g. tuning, the adjustable coil L, and also for controlling the switch S of the parallel resistor R of the arc suppression device 10, for instance.

Current and voltage values used in the various embodiments described herein may be obtained by a suitable measuring arrangement including current and/or voltage transducers (not shown in the figures) connected to the phases of the electric network 20, for example. Voltage and current quantities may also be measured at different locations, for instance. In existing electric networks and systems, such values are typically readily available and thus the implementation of the various embodiments does not necessarily require any separate or additional measuring arrangements. While admittance, conductance, and susceptance are used in the following calculations and definitions, analogous impedance, resistance, and reactance could be used equivalently instead.

The following notation is used in FIG. 1:

$\overline{E}_A$ is the phase A to earth voltage of the source (fundamental frequency phasor)

$\overline{E}_B$ is the phase B to earth voltage of the source (fundamental frequency phasor)

$\overline{E}_C$ is the phase C to earth voltage of the source (fundamental frequency phasor)

$\overline{U}_A$ is the phase A to earth voltage at busbar (fundamental frequency phasor)=$(\overline{E}_A+\overline{U}_o)$ $\overline{U}_B$ is the phase B to earth voltage at busbar (fundamental frequency phasor)=$(\overline{E}_B+\overline{U}_o)$ $\overline{U}_C$ is the phase C to earth voltage at busbar (fundamental frequency phasor)=$(\overline{E}_C+\overline{U}_o)$ $\overline{U}_o$ is the neutral point voltage (the zero-sequence voltage) of the electric network=$(\overline{U}_A+\overline{U}_B+\overline{U}_C)/3$ (fundamental frequency phasor), which can be measured e.g. at the busbar or at the source $\overline{U}_{oCoil}$ is the voltage over the arc suppression device $\overline{I}_A$ is the phase A current at the source (fundamental frequency phasor)

$\overline{I}_B$ is the phase B current at the source (fundamental frequency phasor)

$\overline{I}_C$ is the phase C current at the source (fundamental frequency phasor)

$\overline{I}_{Coil}$ is the current through the arc suppression device (fundamental frequency phasor)

$\overline{Y}_A$ is the phase A to earth admittance of the electric network $Y_B$ is the phase B to earth admittance of the electric network $Y_C$ is the phase C to earth admittance of the electric network $Y_{Coil}$ is the admittance of the arc suppression device (including the possible parallel resistor R)

$Z_{oTr}$ is the zero-sequence impedance per phase of an earthing transformer or a main transformer, or another arrangement, which is used to form the neutral point of the network and through which the arc suppression device is connected to the network:

$$Z_{oTr}=R_{oTr}+j\cdot X_{oTr}$$

where $R_{oTr}$ is the zero-sequence resistance of the earthing transformer or the main transformer (per phase)

$X_{oTr}$ is the zero-sequence reactance of the earthing transformer or the main transformer (per phase)

The zero-sequence impedance $Z_{oTr}$ of the earthing or the main transformer may be in practice dominantly reactive, and thus it may be approximated as: $Z_{oTr} \approx j\sqrt{X_{oTr}}$. In a three-phase network equivalent scheme one third of $Z_{oTr}$ should be applied between the neutral point of the network and the arc suppression device.

The following assumptions can be made for analysis:

The real network can be presented with their shunt admittances neglecting line series impedances as their values may be very small compared with the shunt admittances. Further, the loads and phase-to-phase capacitances of the real system may be disregarded as they do not contribute to the zero-sequence phenomena.

Each individual phase admittance of the total network can be presented with real and imaginary parts:

$$\overline{Y}_A = G_A + j\cdot B_A$$

$$\overline{Y}_B = G_B + j\cdot B_B$$

$$\overline{Y}_C = G_C + j\cdot B_C$$

Admittances may be dominantly capacitive due to phase-to-earth capacitance of the conductors.

Parameter G, i.e. conductance, is the real part of the network phase admittance. The sign is positive and it represents the shunt losses of the network (i.e. losses of insulation in cables and insulators in overhead lines, for example). In case there are distributed compensation coils in the network, their shunt losses may be included in this value.

Parameter B, i.e. susceptance, is the imaginary part of network phase admittance. The sign is positive (capacitive) and it represents the total phase-to-earth capacitance of the network. In case there are distributed compensation coils in the network, their effect may be included in this value.

The zero-sequence impedance of an earthing or a main transformer, or another arrangement, via which the arc suppression device is connected, may be represented with impedance $\overline{Z}_{oTr}=R_{oTr}+j\cdot X_{oTr}$. In a three-phase equivalent scheme one third should be applied between the neutral and earth.

The admittance of the arc suppression device including the possible parallel resistor is presented with admittance $\overline{Y}_{Coil}=G_{coil}-j\cdot B_{coil}$. $G_{coil}$ is the real part of the arc suppression device admittance. In an arc suppression device comprising one or more coils, it includes the coil losses and the possible losses of a parallel resistor(s) of the coil(s) (if applicable). The sign is positive and it represents the resistive losses of the arc suppression device including the parallel resistor if applied. $B_{coil}$ is the imaginary part of the arc suppression device admittance. The sign is negative (inductive) and it represents the inductive current of the arc suppression device, which defines the compensation degree of the network. Note that the signs of $B_{coil}$ and B are opposite, $B_{coil}$ is negative (inductive) and B is positive (capacitive).

Based on FIG. 1, the following equation can be written:

$$\overline{Y}_A \cdot \overline{U}_A + \overline{Y}_B \cdot \overline{U}_B + \overline{Y}_C \cdot \overline{U}_C = -\overline{Y}_{coil\_eq} \cdot \overline{U}_o \qquad \text{Eq. 1a}$$

Where $\overline{Y}_{coil\_eq}$ is the equivalent neutral point admittance taking into account the arc suppression device admittance and the (optional) zero-sequence impedance of the earthing or main transformer.

As the arc suppression device admittance $\overline{Y}_{coil}$ and the zero-sequence impedance of the earthing or main transformer $\overline{Z}_{oTr}/3$ are connected in series, their equivalent total impedance is:

$$\overline{Z}_{coil\_eq} = 1/\overline{Y}_{coil} + \overline{Z}_{oTr}/3 \qquad \text{Eq. 1b}$$

where $\overline{Z}_{oTr}$ is the zero-sequence impedance of the earthing or main transformer per phase in ohms.

Equivalent total impedance $\overline{Z}_{coil\_eq}$ can be converted into corresponding equivalent coil admittance:

$$\overline{Y}_{coil\_eq} = \frac{1}{\overline{Z}_{coil\_eq}} = \frac{3 \cdot \overline{Y}_{coil}}{3 + \overline{Y}_{coil} \cdot \overline{Z}_{oTr}} = G_{coil\_eq} - j \cdot B_{coil\_eq} \qquad \text{Eq. 1c}$$

In case $\overline{Z}_{oTr}=0$ ohm, then $\overline{Y}_{coil\_eq}=\overline{Y}_{coil}$ Phase voltages in the system can be expressed with source voltages and with the neutral point voltage:

$$\overline{U}_A = \overline{E}_A + \overline{U}_o \qquad \text{Eq. 1d}$$

$$\overline{U}_B = \overline{E}_B + \overline{U}_o \qquad \text{Eq. 1e}$$

$$\overline{U}_C = \overline{E}_C + \overline{U}_o \qquad \text{Eq. 1f}$$

Taking phase A as a reference with a phase angle of zero degrees and assuming an ideal three-phase system with 120° phase shift between the phases with a phase rotation order A-B-C, and neglecting the source impedance so that the source phase voltage magnitude for phase A equals $\overline{E}_A = U_{PE}$ ($\overline{E}_A$ has only a real part when phase A is assumed the reference having the phase angle of zero), the following can be written:

$$\overline{U}_A = U_{PE} + \overline{U}_o \qquad \text{Eq. 1g}$$

$$\overline{U}_B = \overline{a}^2 \cdot U_{PE} + \overline{U}_o \qquad \text{Eq. 1h}$$

$$\overline{U}_C = \overline{a} \cdot U_{PE} + \overline{U}_o \qquad \text{Eq. 1i}$$

where $\overline{a}=\cos(120°)+j\cdot\sin(120°)$ and $\overline{a}^2=\cos(240°)+j\cdot\sin(240°)$.

Substituting equations 1g to 1i into equation 1a the following is obtained:

$$\overline{Y}_A \cdot (U_{PE}+\overline{U}_o) + \overline{Y}_B \cdot (\overline{a}^2 \cdot U_{PE}+\overline{U}_o) + \overline{Y}_C \cdot (\overline{a} \cdot U_{PE}+\overline{U}_o) =$$
$$-\overline{Y}_{coil\_eq} \cdot \overline{U}_o \qquad \text{Eq. 1j}$$

From equation 1j, neutral point voltage $\overline{U}_o$ can be solved:

$$\overline{U}_o = U_{PE} \cdot \frac{\overline{Y}_A + \overline{a}^2 \cdot \overline{Y}_B + \overline{a} \cdot \overline{Y}_C}{\overline{Y}_A + \overline{Y}_B + \overline{Y}_C \overline{Y}_{coil\_eq}} \quad \text{Eq. 1k}$$

Using Notations:

$$\overline{Y}_{net} = \overline{Y}_A + \overline{Y}_B + \overline{Y}_C = G_{net} + j \cdot B_{net}, \text{ and} \quad \text{Eq. 1l}$$

$$\overline{Y}_{coil\_eq} = G_{coil\_eq} - j \cdot B_{coil\_eq}, \text{ then}$$

$$\overline{U}_o = U_{PE} \cdot \frac{\overline{Y}_A + \overline{a}^2 \cdot \overline{Y}_B + \overline{a} \cdot \overline{Y}_C}{\overline{Y}_{net} + \overline{Y}_{coil\_eq}}$$

In a resonance condition $U_o$ reaches a maximum value when network susceptance $+B_{net}$ and equivalent coil susceptance $-B_{coil\_eq\_res}$ cancel each other, equation 1l can be written into the following format:

$$\max(\overline{U}_o) = \overline{U}_{o\_res} = U_{PE} \cdot \frac{\overline{Y}_A + \overline{a}^2 \cdot \overline{Y}_B + \overline{a} \cdot \overline{Y}_C}{G_{net} + G_{coil\_eq}} \quad \text{Eq. 1m}$$

And finally, as $G_{net} + G_{coil\_eq} = G_{tot}$, the following can be obtained:

$$\max(\overline{U}_o) = \overline{U}_{o\_res} = U_{PE} \cdot \frac{\overline{Y}_A + \overline{a}^2 \cdot \overline{Y}_B + \overline{a} \cdot \overline{Y}_C}{G_{tot}} \quad \text{Eq. 1n}$$

The numerator of equation 1n is called as asymmetry (imbalance) admittance, $\overline{Y}_{asymm}$:

$$\overline{Y}_{asymm} = \overline{Y}_A + \overline{a}^2 \cdot \overline{Y}_B + \overline{a} \cdot \overline{Y}_C \quad \text{Eq. 1o}$$

The conductance and susceptance parts of the coil at resonance can be determined as follows considering the effect of earthing or main transformer reactance $\text{Im}(\overline{Z}_{oTr})$:

$$G_{coil\_res} = G_{coil} \quad \text{Eq. 1p}$$

$$B_{coil\_res} = \frac{1}{1/\text{Im}(\overline{Y}_{net}) - \text{Im}(\overline{Z}_{oTr})/3} \quad \text{Eq. 1q}$$

In a resonance condition the equivalent coil admittance is $\overline{Y}_{coil\_eq\_res} = G_{coil\_eq\_res} - j \cdot B_{coil\_eq\_res}$ and its imaginary part matches the imaginary part of network admittance $\text{Im}(\overline{Y}_{net})$ taking account of the effect of earthing or main transformer reactance $\text{Im}(\overline{Z}_{oTr})$.

After $G_{coil\_res}$ and $B_{coil\_res}$ have been determined, then the conductance value $G_{coil\_eq\_res}$ can be calculated as:

$$G_{coil\_eq\_res} = \frac{9 \cdot G_{coil\_res}}{G_{coil\_res}^2 \cdot X_{oTr}^2 + B_{coil\_res}^2 \cdot X_{oTr}^2 + 6 \cdot B_{coil\_res} \cdot X_{oTr} + 9} \quad \text{Eq. 1r}$$

The susceptance value $B_{coil\_eq\_res}$ can be calculated as:

$$B_{coil\_eq\_res} = \frac{3 \cdot (X_{oTr} \cdot G_{coil\_res}^2 + X_{oTr} \cdot B_{coil\_res}^2 + 3 \cdot B_{coil\_res})}{G_{coil\_res}^2 \cdot X_{oTr}^2 + B_{coil\_res}^2 \cdot X_{oTr}^2 + 6 \cdot B_{coil\_res} X_{oTr} + 9} \quad \text{Eq. 1s}$$

Figure 2:
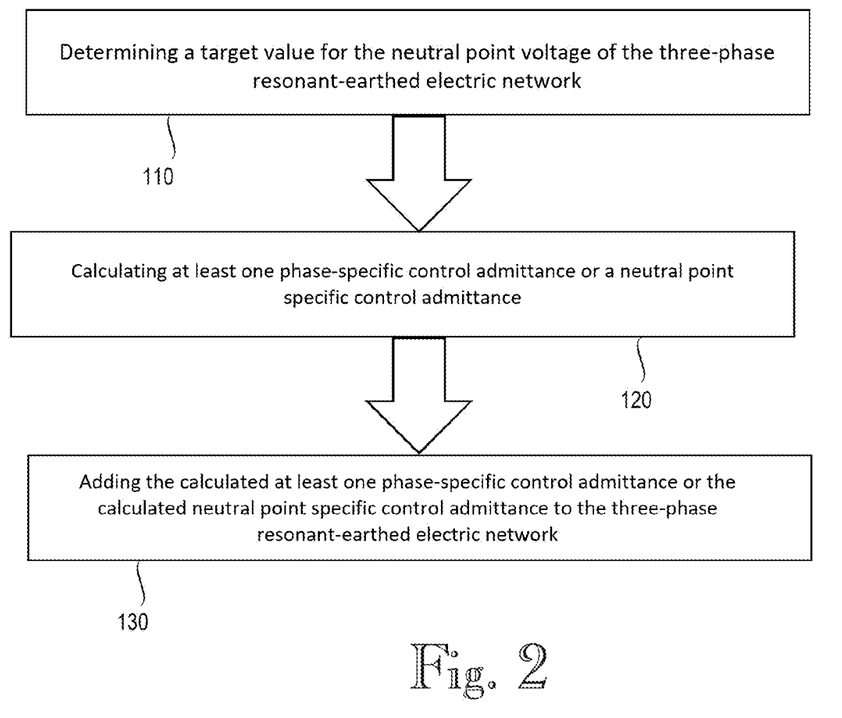
FIG. 2 shows a flow diagram according to an embodiment.

According to an embodiment, and as illustrated in exemplary FIG. 2, a method for controlling the neutral point voltage of a three-phase resonant-earthed electric network comprises determining 110 a target value for the neutral point voltage of the three-phase resonant-earthed electric network, calculating 120 at least one phase-specific control admittance or a neutral point specific control admittance required for controlling the neutral point voltage of the three-phase resonant-earthed electric network from a prevailing value to the determined target value, and adding 130 the calculated at least one phase-specific control admittance between a ground and a respective phase of the three-phase resonant-earthed electric network or the calculated neutral point specific control admittance between the ground and a neutral point of the three-phase resonant-earthed electric network. In the following, some exemplary embodiments for such controlling of the neutral point voltage of the three-phase resonant-earthed electric network are disclosed. According to an embodiment, the determined target value for the neutral point voltage of the three-phase resonant-earthed electric network is valid at a resonance of the three-phase resonant-earthed electric network either prior or after the adding 130 of the calculated control admittance.

First Exemplary Embodiment

According to an embodiment, the calculating 120 comprises calculating one phase-specific control admittance based on a total damping of the three-phase resonant-earthed electric network, the determined target value for the neutral point voltage of the three-phase resonant-earthed electric network, and a source phase voltage magnitude of the three-phase resonant-earthed electric network. According to an embodiment, the determined target value of the neutral point voltage of the three-phase resonant-earthed electric network may be higher than the prevailing value of the neutral point voltage of the three-phase resonant-earthed electric network. According to an embodiment, the prevailing value of the neutral point voltage of the three-phase resonant-earthed electric network may be essentially zero. In the following, respective examples of the calculating of the phase-specific control admittance are disclosed.

E.g. three-phase underground cables are typically very symmetrical in terms of their phase-to-earth capacitances of individual phases. This means that in networks, where conductors are dominantly such three-phase cables, phase-to-earth admittances of different phases may have (almost) equal values, i.e. $\overline{Y}_A \cong \overline{Y}_B \cong \overline{Y}_C$. This means that the numerator in Equation 1n may become essentially zero, which can result in a very small healthy-state neutral point voltage Uo, even at the resonance condition. A small value of Uo may be advantageous from an earth-fault detection perspective, as it allows application of sensitive earth-fault detection settings (Uo, Io thresholds), for instance. However, a drawback of too low Uo value, may be that a coil tuner of an arc suppression device may not be able to complete the tuning process (i.e. to calculate the size of the network capacitance), for example, as it may require a measurable variation of Uo as a function of the coil tuning. Moreover, coil tuning methods applicable for such networks with a small admittance unbalance, may involve power electronics-based methods (current may be injected into the system neutral point to raise Uo), for example, which may increase cost and complexity compared with traditional coil tuning methods.

Consequently, according to an embodiment, the neutral point voltage Uo may be raised from zero, or essentially zero, to a pre-defined level valid at resonance by suitably manipulating the phase admittances and thus the system unbalance admittance: $\overline{Y}_{asymm} = \overline{Y}_A + \overline{a}^2 \cdot \overline{Y}_B + \overline{a} \cdot \overline{Y}_C$. It may be assumed that the network 20 is initially essentially fully balanced in terms of admittances, i.e. $\overline{Y}_A = \overline{Y}_B = \overline{Y}_C$, and thus $Y_{asymm}=0$. Hence, according to an embodiment, an admittance unbalance may be created by adding a pre-calculated phase-specific control admittance, $\overline{Y}_{xA}$, $\overline{Y}_{xB}$ or $\overline{Y}_{xC}$, either into phase A, B or C, respectively. According to an embodiment, a pre-requirement may be that a value of a total system damping $G_{tot}$, e.g. in terms of coil conductance $G_{coil}$ and coil position, is known. The total system damping is composed of losses of the coil(s), shunt losses of conductors (insulation losses in cables, insulator losses in overhead lines), longitudinal zero-sequence losses in case of long cable feeders and the losses of the parallel resistor of the coil, for example. The total system damping $G_{tot}$ can be approximated from these values. According to an embodiment, when determining the coil conductance value to be included in the $G_{tot}$ value, the coil position may be needed to take account of the effect of the zero-sequence impedance of the earthing or main transformer $\overline{Z}_{oTr}$ as described earlier.

In the following, a numerical example, based on exemplary parameter values, for the approximation of the total system damping $G_{tot}$ is given:

In a 20 kV network with uncompensated capacitive earth-fault current of 110 A, coil position is 100 A, losses of the coil are 2% from the coil position, shunt losses of conductors are 5 A, losses of the parallel resistor of the coil are 10 A, and earthing transformer reactance $X_{oTr}$ is 9 ohm per phase. Determine total system damping $G_{tot}$ including the effect of earthing transformer at resonance condition.

Solution:

$$\overline{Y}_{net}=(5A+j\cdot110A)/(20\text{ kV}/\text{sqrt}(3))=0.433+j\cdot9.526\text{ mS}$$

The conductance and susceptance parts of the coil at resonance:

$G_{coil\_res} =$                                                                      Equation 1p $G_{coil} = ((100A * 0.02) + 10A)/(20\text{ kV}/sqrt(3)) = 1.039\text{ m}S$.

$B_{coil\_res} = \dfrac{1}{1/\text{Im}(\overline{Y}_{net}) - \text{Im}(\overline{Z}_{oTr})/3} = 9.807\text{ m}S$   Equation 1q In order to take into account the effect of earthing or main transformer reactance $\text{Im}(\overline{Z}_{oTr})$:

$G_{coil\_eq\_res}=0.981\text{ mS}$                                                Equation 1r $B_{coil\_eq\_res}=9.529\text{ mS}$                                                Equation 1s:

Then $G_{tot}=G_{coil\_eq\_res}+\text{Re}(\overline{Y}_{net})=0.981$ mS+0.4333 mS=1.414 mS (including coils losses, parallel resistor of the coil and shunt losses of conductors, taking into account the effect of earthing transformer reactance $X_{oTr}$).

According to an embodiment, the calculating may further comprise varying a phase angle of the determined target value for the neutral point voltage of the three-phase resonant-earthed electric network to obtain the at least one phase-specific control admittance such that one or more predetermined conditions are fulfilled. In the following, respective examples of the calculating of the phase-specific control admittance are disclosed.

The target value for the neutral point voltage is noted as $\overline{U}_{o\_target}=\text{reUotarget}+j\cdot\text{imUotarget}$ (a complex value) with an amplitude of $U_{o\_target}$.

In case the control admittance is to be connected into phase A ($\overline{Y}_{xA}=G_{xA}+j\cdot B_{xA}$), the following can be written (valid at resonance after the adding 130 of the control admittance):

$$\overline{U}_{o\_target} = \text{re } Uo \text{ target} + j \cdot \text{im } Uo \text{ target} = -U_{PE} \cdot \dfrac{G_{xA} + j \cdot B_{xA}}{G_{tot} + G_{xA}} \quad \text{Eq. 2a1}$$

By dividing the equation into real and imaginary parts, the control admittance $\overline{Y}_{xA}=G_{xA}+j\cdot B_{xA}$ for phase A can be solved:

$G_{xA}=-\text{reUotarget}*G_{tot}/(\text{reUotarget}+U_{PE})$    Eq. 2a2

$B_{xA}=-\text{imUotarget}*G_{tot}/(\text{reUotarget}+U_{PE})$    Eq. 2a3

In case the control admittance is to be connected into phase B, ($\overline{Y}_{xB}=G_{xB}+j\cdot B_{xB}$), the following can be written (valid at resonance after the adding 130 of control admittance, $\overline{b}=\cos(2400)+j\cdot\sin(240°)=\text{reb}+j\cdot\text{imb}$):

$$\overline{U}_{o\_target} = \text{re } Uo \text{ target} + j \cdot \text{im } Uo \text{ target} = -\overline{b} \cdot U_{PE} \dfrac{G_{xB} + j \cdot B_{xB}}{G_{tot} + G_{xB}} \quad \text{Eq. 2b1}$$

By dividing the equation into real and imaginary parts, the control admittance $\overline{Y}_{xB}=G_{xB}+j\cdot B_{xB}$ for phase B can be solved:

$G_{xB}=-G_{tot}*(\text{reb}*\text{reUotarget}+\text{imb}*\text{imUotarget})/(U_{PE}*$
$\quad(\text{reb}^2+\text{imb}^2)+\text{reb}*\text{reUotarget}+\text{imb}*\text{imUotarget})$    Eq. 2b2

$B_{xB}=G_{tot}*(\text{imb}*\text{reUotarget}-\text{imUotarget}*\text{reb})/(U_{PE}*$
$\quad(\text{reb}^2+\text{imb}^2)+\text{reb}*\text{reUotarget}+\text{imb}*\text{imUotarget})$    Eq. 2b3

In case the control admittance is to be connected into phase C, ($\overline{Y}_{xC}=G_{xC}+j\cdot B_{xC}$), the following can be written (valid at resonance after the adding 130 of control admittance, $\overline{a}=\cos(1200)+j\cdot\sin(120°)=\text{rea}+j\cdot\text{ima}$):

$$\overline{U}_{o\_target} = \text{re } Uo \text{ target} + j \cdot \text{im } Uo \text{ target} = -\overline{a} \cdot U_{PE} \dfrac{G_{xC} + j \cdot B_{xC}}{G_{tot} + G_{xC}} \quad \text{Eq. 2c1}$$

By dividing the equation into real and imaginary parts, the control admittance $\overline{Y}_{xC}=G_{xC}+j\cdot B_{xC}$ for phase C can be solved:

$G_{xC}=-G_{tot}*(\text{rea}*\text{reUotarget}+\text{ima}*\text{imUotarget})/(U_{PE}*$
$\quad(\text{rea}^2+\text{ima}^2)+\text{rea}*\text{reUotarget}+\text{ima}*\text{imUotarget})$    Eq. 2c2

$B_{xC}=G_{tot}*(\text{ima}*\text{reUotarget}-\text{imUotarget}*\text{rea})/(U_{PE}*$
$\quad(\text{rea}^2+\text{ima}^2)+\text{rea}*\text{reUotarget}+\text{ima}*\text{imUotarget})$    Eq. 2c3

In the above solutions, always a ($G_x$, $B_x$)-pair is obtained, valid at predefined value of $\overline{U}_{o\_target}$ (=reUotarget+j·imUotarget=Uotarget·(cos(phi)+j·sin(phi))). According to an embodiment, the solution can be affected by varying the phase angle (phi) of the target neutral point voltage $\overline{U}_{o\_target}$ between 0-360 deg. The control admittance $\overline{Y}_x=G_x+j\cdot B_x$ should preferably be selected so that that the solution has only susceptance, i.e. the real part of the control admittance is zero. This can be achieved by selecting the solution according to the phase angle of $\overline{U}_{o\_target}$ which provides a control admittance consisting essentially only of the susceptance part (conductance part becomes zero or near zero). The control susceptance may be positive or negative (i.e. capacitive or inductive) depending on the value of the phase angle of $\overline{U}_{o\_target}$. A positive value of susceptance ($B_{xA}$, $B_{xB}$, $B_{xC}$) equals a capacitive element (e.g. a capacitor), and a negative value of susceptance equals an inductive element (e.g. an inductor). Only a positive value of conductance ($G_{xA}$, $G_{xB}$, $G_{xC}$) is physically feasible.

Figure 3:
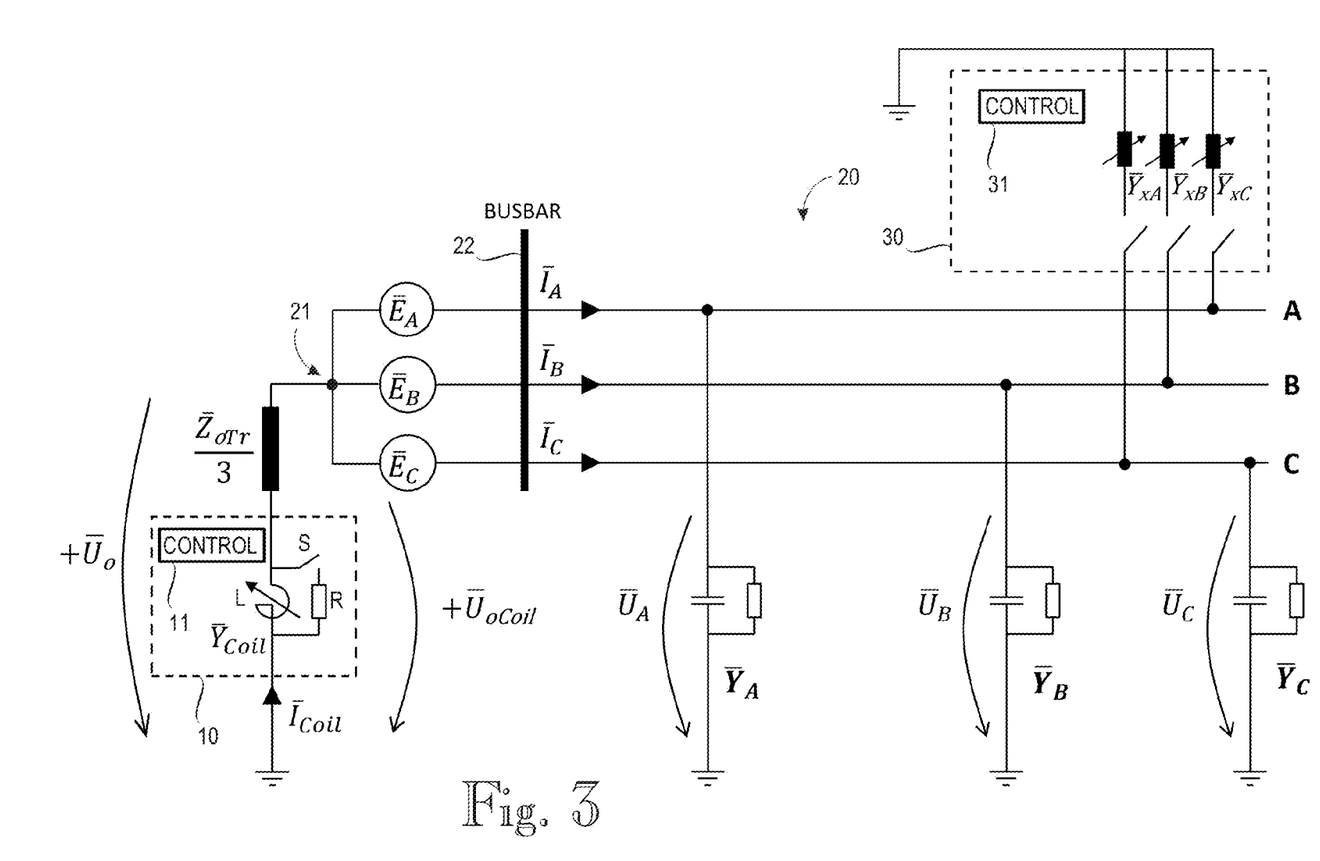
FIG. 3 shows an example of a three-phase electric network according to an embodiment.

After the phase-specific control admittance is calculated 120, the calculated at least one phase-specific control admittance is added 130, e.g. by suitable admittance control means connected to the three-phase resonant-earthed electric network 20, between the ground and the respective phase of the three-phase resonant-earthed electric network 20. FIG. 3 illustrates a three-phase electric network 20 corresponding to that shown also in FIG. 1. The exemplary three-phase network 20 shown in FIG. 3 is equipped with an arc suppression device 10 which is provided with a control arrangement 11, such as a controller device or a control unit of the arc suppression device 10, located e.g. within the arc suppression device 10 as illustrated. Such a control arrangement 11 could also be located outside the arc suppression device 10 and could be configured to control more than one arc suppression devices 10, for example. In the exemplary system of FIG. 3, at least part of the functionality of the various embodiments may be provided by means of the control arrangement 11 of the arc suppression device 10, for example. The control arrangement 11 of the arc suppression device 10 may be configured to receive necessary measurement data and/or perform at least some measurements by itself, and to control, i.e. tune, the adjustable coil L of the arc suppression device 10. The control arrangement 11 of the arc suppression device may also be configured to control on/off the switch S of the parallel resistor R of the arc suppression device 10, for instance. The exemplary three-phase network shown in FIG. 3 is further equipped with an admittance control arrangement with which a phase-specific control admittance $\overline{Y}_{xA}, \overline{Y}_{xB}, \overline{Y}_{xC}$ can be added between the ground and the respective phase A, B, C of the three-phase electric network 20. The admittance control arrangement 30 may comprise one or more components, such as e.g. resistor(s), and/or capacitor(s), and/or inductor(s), capable of providing the desired admittance. Such components may be adjustable and/or connectable in series and/or in parallel in suitable manner to adjust the total admittance provided by the arrangement. The admittance control arrangement 30 may also comprise suitable switching means such as one or more controllable electromechanical switches and/or one or more semiconductor switches enabling the switching of the admittance providing component(s). The admittance control arrangement 30 could also be implemented by means of a static synchronous compensator, i.e. STATCOM, device or a similar power electronics device, which is able to provide the desired control admittance to be added in an equivalent way, for example. The exemplary admittance control arrangement 30 is provided with a control arrangement 31, such as a controller device or a control unit. Such a control arrangement 31 could be a separate entity as illustrated in the example or integrated with the control arrangement 11 of the arc suppression device 10, for example. In the exemplary system of FIG. 3, at least part of the functionality of the various embodiments may be provided by means of the control arrangement 31 of the admittance control arrangement 30, for example. The control arrangement 31 may be configured to calculate and adjust the value(s) of the phase-specific control admittance(s) $\overline{Y}_{xA}, \overline{Y}_{xB}, \overline{Y}_{xC}$ and to add (and remove), i.e. connect (and disconnect), the phase-specific control admittance(s) $\overline{Y}_{xA}, \overline{Y}_{xB}, \overline{Y}_{xC}$ between the ground and the respective phase(s) A, B, C of the three-phase electric network 20, for instance.

In networks, where conductors are dominantly overhead lines, for example, the resulting admittance imbalance may depend on used tower geometry (which typically varies between line sections), but it may be typically significantly higher than with cables, for instance. In case of a high admittance imbalance, the resulting healthy-state neutral point voltage Uo may reach value, which limits the performance of the earth fault detection, for example. In extreme cases, high admittance unbalance may result in severe phase over-voltages as the phase voltages are dependent on the neutral point voltage. Too high admittance unbalance may not allow a practical implementation of a resonant earthing and may thus require admittance unbalance compensation. This may be especially valid in networks with 1-phase or 2-phase line sections, for example.

Second Exemplary Embodiment

According to an embodiment, the calculating 120 comprises calculating one phase-specific control admittance based on total phase-to-earth admittances for each phase of the three-phase resonant-earthed electric network, a coil admittance of an arc suppression coil of the three-phase resonant-earthed electric network at a resonance of the three-phase resonant-earthed electric network, a source phase-to-earth voltage magnitude of the three-phase resonant-earthed electric network, and the determined target value for the neutral point voltage of the three-phase resonant-earthed electric network. According to an embodiment, the total phase-to-earth admittances for each phase of the three-phase resonant-earthed electric network are determined based on three different values of the coil admittance of the arc suppression coil of the three-phase resonant-earthed electric network, and respective three values of a zero-sequence voltage and of phase voltages of the three-phase resonant-earthed electric network. According to an embodiment, the calculating may further comprise varying a phase angle of the determined target value for the neutral point voltage of the three-phase resonant-earthed electric network to obtain the at least one phase-specific control admittance such that one or more predetermined conditions are fulfilled. In the following, respective examples of the calculating of the phase-specific control admittance are disclosed.

According to an embodiment, the neutral point voltage Uo may be changed from any prevailing level to a pre-defined level valid at resonance by suitably manipulating the phase admittances and thus the system unbalance admittance: $\overline{Y}_{asymm} = \overline{Y}_A + \overline{a}^2 \overline{Y}_{BC} + \overline{a} \cdot \overline{Y}_C$. According to an embodiment, three known values for the coil admittance (which may be expressed by respective equivalent coil admittances $\overline{Y}_{coil\_eq1}, \overline{Y}_{coil\_eq2}, \overline{Y}_{coil\_eq3}$, according to Eq. 1c), which correspond to three values (marked with subscripts 1, 2 and 3) of the zero-sequence voltage ($\overline{U}_{o1}, \overline{U}_{o2}, \overline{U}_{o3}$) and the phase voltages ($\overline{U}_{A1}, \overline{U}_{A2}, \overline{U}_{A3}$), ($\overline{U}_{B1}, \overline{U}_{B2}, \overline{U}_{B3}$) and ($\overline{U}_{C1}, \overline{U}_{C2}, \overline{U}_{C3}$) valid during the healthy state of the network may be utilized. From these three coil states, three equations describing the zero-sequence voltage and phase voltages as a function of coil admittance can be written:

$$\overline{Y}_A \cdot \overline{U}_{A1} + \overline{Y}_B \cdot \overline{U}_{B1} + \overline{Y}_C \cdot \overline{U}_{C1} = -\overline{Y}_{coil\_eq1} \cdot \overline{U}_{o1} \quad \text{Eq. 3a}$$

$$\overline{Y}_A \cdot \overline{U}_{A2} + \overline{Y}_B \cdot \overline{U}_{B2} + \overline{Y}_C \cdot \overline{U}_{C2} = -\overline{Y}_{coil\_eq2} \cdot \overline{U}_{o2} \quad \text{Eq. 3b}$$

$$\overline{Y}_A \cdot \overline{U}_{A3} + \overline{Y}_B \cdot \overline{U}_{B3} + \overline{Y}_C \cdot \overline{U}_{C3} = \times \overline{Y}_{coil\_eq3} \cdot \overline{U}_{o3} \quad \text{Eq. 3c}$$

From Equations 3a-3c, the total phase to earth admittances for each phase (A, B and C) can be solved (in the following equations 3d-3f all variables are complex phasors, e.g. UB1, Ycoil_eq2 etc.):

$$\overline{Y}_A = -(-UB1*Ycoil\_eq2*Uo2*UC3+UB1*UC2*Ycoil\_eq3*Uo3+UC1*UB3*Ycoil\_eq2*Uo2-$$
$$UC1*UB2*Ycoil\_eq3*Uo3+$$
$$Ycoil\_eq1*Uo1*UB2*UC3-$$
$$Ycoil\_eq1*Uo1*UB3*UC2)/(UA1*UB2*UC3-$$

$$UA1*UB3*UC2-UA2*UB1*UC3+$$
$$UB3*UA2*UC1-UB2*UA3*UC1+$$
$$UA3*UB1*UC2) \quad \text{Eq. 3d}$$

$$\overline{Y}_B=(-UA1*Ycoil\_eq2*Uo2*UC3+UA1*UC2*Ycoil\_eq3*$$
$$Uo3-UA2*UC1*Ycoil\_eq3*Uo3-$$
$$UC2*UA3*Ycoil\_eq1*Uo1+$$
$$Ycoil\_eq2*Uo2*UA3*UC1+$$
$$UA2*Ycoil\_eq1*Uo1*UC3)/(UA1*UB2*UC3-$$
$$UA1*UB3*UC2-UA2*UB1*UC3+$$
$$UB3*UA2*UC1-UB2*UA3*UC1+$$
$$UA3*UB1*UC2) \quad \text{Eq. 3e}$$

$$\overline{Y}_C=-(UB3*UA2*Ycoil\_eq1*Uo1-UA1*UB3*Ycoil\_eq2*$$
$$Uo2+UA1*UB2*Ycoil\_eq3*Uo3-$$
$$UB2*UA3*Ycoil\_eq1*Uo1-$$
$$UA2*UB1*Ycoil\_eq3*Uo3+$$
$$UA3*UB1*Ycoil\_eq2*Uo2)/(UA1*UB2*UC3-$$
$$UA1*UB3*UC2-UA2*UB1*UC3+$$
$$UB3*UA2*UC1-UB2*UA3*UC1+$$
$$UA3*UB1*UC2) \quad \text{Eq. 3f}$$

Consequently, according to an embodiment, the network resonance point voltage (at resonance prior to the adding 130 of control admittance taking account of the effect of zero-sequence impedance of the earthing or main transformer $\overline{Z}_{oTr}$) can be manipulated by affecting the system unbalance admittance value by adding pre-calculated phase-specific control admittance ($\overline{Y}_{xA}$, $\overline{Y}_{xB}$ or $\overline{Y}_{xC}$) either into phase A, B or C. According to an embodiment, the calculating may further comprise varying a phase angle of the determined target value for the neutral point voltage of the three-phase resonant-earthed electric network to obtain the at least one phase-specific control admittance such that one or more predetermined conditions are fulfilled. In the following, respective examples of the calculating of the phase-specific control admittance are disclosed by using the values of phase admittances ($\overline{Y}_A$, $\overline{Y}_B$, $\overline{Y}_C$) obtained based on equations 3d-3f:

In case the control admittance is to be connected into phase A, the following can be written:

$$(\overline{Y}_A+\overline{Y}_{xA})\cdot\overline{U}_{A\_target}+\overline{Y}_B\cdot\overline{U}_{B\_target}+\overline{Y}_C\cdot\overline{U}_{C\_target}=$$
$$-\overline{Y}_{coil\_eq\_res}\cdot\overline{U}_{o\_target} \quad \text{Eq. 4a}$$

From which control admittance $\overline{Y}_{xA}$ can be solved:

$$\overline{Y}_{xA}=-\overline{Y}_A\cdot\overline{U}_{A\_target}+\overline{Y}_B\cdot\overline{U}_{B\_target}+\overline{Y}_C\cdot\overline{U}_{C\_target}+$$
$$\overline{Y}_{coil\_eq\_res}\cdot\overline{U}_{o\_target})/\overline{U}_{A\_target} \quad \text{Eq. 4b}$$

In case the control admittance is to be connected into phase B, the following can be written:

$$\overline{Y}_A\cdot\overline{U}_{A\_target}+(\overline{Y}_B+\overline{Y}_{xB})\cdot\overline{U}_{B\_target}+\overline{Y}_C\cdot\overline{U}_{C\_target}=$$
$$-\overline{Y}_{coil\_eq\_res}\cdot\overline{U}_{o\_target} \quad \text{Eq. 4c}$$

From which control admittance $\overline{Y}_{xB}$ can be solved:

$$\overline{Y}_{xB}=-(\overline{Y}_A\cdot\overline{U}_{A\_target}+\overline{Y}_B\cdot\overline{U}_{B\_target}+\overline{Y}_C\cdot\overline{U}_{C\_target}+$$
$$\overline{Y}_{coil\_eq\_res}\cdot\overline{U}_{o\_target})/\overline{U}_{B\_target} \quad \text{Eq. 4d}$$

In case the control admittance is to be connected into phase C, the following can be written:

$$\overline{Y}_A\cdot\overline{U}_{A\_target}+\overline{Y}_B\cdot\overline{U}_{B\_target}+(\overline{Y}_C+\overline{Y}_{xC})\cdot\overline{U}_{C\_target}=$$
$$-\overline{Y}_{coil\_eq\_res}\cdot\overline{U}_{o\_target} \quad \text{Eq. 4e}$$

From which control admittance $\overline{Y}_{xC}$ can be solved:

$$\overline{Y}_{xC}=-(\overline{Y}_A\cdot\overline{U}_{A\_target}+\overline{Y}_B\cdot\overline{U}_{B\_target}+\overline{Y}_C\cdot\overline{U}_{C\_target}+$$
$$\overline{Y}_{coil\_eq\_res}\cdot\overline{U}_{o\_target})/\overline{U}_{C\_target} \quad \text{Eq. 4f}$$

where $$\overline{U}_{A\_target}=U_{PE}+\overline{U}_{o\_target} \quad \text{Eq. 5a}$$

$$\overline{U}_{B\_target}=\overline{a}^2\cdot U_{PE}+\overline{U}_{o\_target} \quad \text{Eq. 5b}$$

$$\overline{U}_{C\_target}=\overline{a}\cdot U_{PE}+\overline{U}_{o\_target} \quad \text{Eq. 5c}$$

And where $\overline{Y}_{coil\_eq\_res}=G_{coil\_eq\_res}-j\cdot B_{coil\_eq\_res}$ is the equivalent coil admittance at resonance condition (at resonance prior to the adding 130 of control admittance taking account of the effect of zero-sequence impedance of the earthing or main transformer $\overline{Z}_{oTr}$), refer to Eq. 1r and Eq. 1s.

The target value for the neutral point voltage $\overline{U}_{o\_target}$ may be reached at the resonance point valid in the network prior to the adding 130 of the phase-specific control admittance. The target value for the neutral point voltage $\overline{U}_{o\_target}$ may be equally reached after the adding 130 of the phase-specific control admittance at detuning degree corresponding to the imaginary part of the inserted phase-specific control admittance. In case the imaginary part of added admittance is capacitive, then detuning degree is undercompensated.

The solution for the control admittance $\overline{Y}_x$ is a complex number with a magnitude and phase angle depending on the actual system imbalance composition and prevailing damping value, for example. In the solutions above, a positive value of susceptance equals a capacitive element, a negative value of susceptance equals an inductive element. Solutions with a negative conductance value are not physically valid solutions.

After the phase-specific control admittance is calculated 120 using Equations 4a-4f, the calculated, phase-specific control admittance may be added 130 between the ground and the respective phase of the three-phase resonant-earthed electric network 20 e.g. by suitable admittance control means as described earlier with reference to exemplary FIG. 3.

According to an embodiment, the solution for the control admittance can be affected by varying the phase angle (phi) of the target neutral point voltage $\overline{U}_{o\_target}$=reUotarget+j·imUotarget=$U_{o\_target}\cdot(\cos(phi)+j\cdot\sin(phi))$ between 0-360 deg. Therefore, an optimal solution can be selected according to the phase angle of $\overline{U}_{o\_target}$ which provides a control admittance to be added so that:

a) The phase-wise added control admittance should have as small value as possible
b) The resistive part of the phase-wise added control admittance should be positive and have as small value as possible
c) The imaginary part of the phase-wise added control admittance can be either positive (capacitive) or negative (inductive)

Any value of the resistive part of phase-wise added admittance, e.g. a shunt resistance or conductance, is not preferable as connecting a conductance into the phase could result into continuous added system losses.

Third Exemplary Embodiment

According to an embodiment, the calculating 120 comprises calculating two phase-specific control admittances based on total phase-to-earth admittances for each phase of the three-phase resonant-earthed electric network, a coil admittance of an arc suppression coil of the three-phase resonant-earthed electric network at a resonance of the three-phase resonant-earthed electric network, a source phase-to-earth voltage magnitude of the three-phase resonant-earthed electric network, and the determined target value for the neutral point voltage of the three-phase resonant-earthed electric network. According to an embodiment, the two phase-specific control admittances may be essentially pure susceptances, i.e. admittances with essentially zero conductances. According to an embodiment, the total phase-to-earth admittances for each phase of the three-phase resonant-earthed electric network are determined based on three different values of the coil admittance of the arc suppression coil of the three-phase resonant-earthed electric network, and respective three values of a zero-sequence voltage and of phase voltages of the three-phase resonant-earthed electric network. According to an embodiment, the calculating may further comprise varying a phase angle of the determined target value for the neutral point voltage of the three-phase resonant-earthed electric network to obtain the two phase-specific control admittances such that one or more predetermined conditions are fulfilled. In the following, respective examples of the calculating of the two phase-specific control admittances are disclosed. In the examples the coil admittance has been expressed by means of the equivalent coil admittance based on Eq. 1c.

According to an embodiment, the neutral point voltage Uo may be changed from any prevailing level to a predefined level by suitably manipulating the imaginary parts of the phase admittances, i.e. susceptances, in pairs either in phases A and B, phases B and C or phases C and A. The total phase to earth admittances $\overline{Y}_A$, $\overline{Y}_B$, $\overline{Y}_C$ for each phase A, B and C can be solved based on Equations 3d-3f.

In case control admittances with susceptances $B_{xA}$, $B_{xB}$ are to be added into phases A and B, the following can be written:

$$(\overline{Y}_A + j \cdot B_{xA}) \cdot \overline{U}_{A\_target} + (\overline{Y}_B + j \cdot B_{xB}) \cdot \overline{U}_{B\_target} + \overline{Y}_C \cdot \overline{U}_{C\_target} = -\overline{Y}_{coil\_eq\_res} \cdot \overline{U}_{o\_target} \quad \text{Eq. 6a}$$

By dividing the equation into real and imaginary parts, susceptances $B_{xA}$ and $B_{xB}$ can be solved as:

$B_{xA}=-(-BA*\text{reUAtarget}*\text{imUBtarget}-$
  $GB*\text{imUBtarget}^2-\text{reUBtarget}*GA*\text{reUAtarget}-$
  $GB*\text{reUBtarget}^2-$
  $\text{reUBtarget}*\text{Gcoil\_eq\_res}*\text{reUotarget}-$
  $\text{Gcoil\_eq\_res}*\text{imUotarget}*\text{imUBtarget}+$
  $\text{Bcoil\_eq\_res}*\text{reUotarget}*\text{imUBtarget}+$
  $BA*\text{imUAtarget}*\text{reBtarget}-$
  $GA*\text{imUAtarget}*\text{imUBtarget}-$
  $BC*\text{reUCtarget}*\text{imUBtarget}-$
  $GC*\text{imUCtarget}*\text{imUBtarget}-\text{reUBtarget}*\text{Bcoil}$
  $\text{eqres}*\text{imUotarget}-\text{reUBtarget}*GC*\text{reUCtarget}+$
  $\text{reUBtarget}*BC*\text{imUCtarget})/(-$
  $\text{reUAtarget}*\text{imUBtarget}+$
  $\text{imUAtarget}*\text{reUBtarget})$ Eq. 6b $B_{xB}=-(GA*\text{reUAtarget}^2+$
  $\text{reUAtarget}*GB*\text{reUBtarget}-$
  $\text{reUAtarget}*BB*\text{imUBtarget}+$
  $\text{reUAtarget}*\text{Bcoil\_eq\_res}*\text{imUotarget}+$
  $\text{reUAtarget}*GC*\text{reUCtarget}-$
  $\text{reUAtarget}*BC*\text{imUCtarget}+$
  $\text{reUAtarget}*\text{Gcoil\_eq\_res}*\text{reUotarget}+$
  $\text{imUAtarget}*GC*\text{imUCtarget}+$
  $\text{imUAtarget}*GB*\text{imUBtarget}+$
  $GA*\text{imUAtarget}^2+$
  $\text{imUAtarget}*BC*\text{reUCtarget}-$
  $\text{imUAtarget}*\text{Bcoil\_eq\_res}*\text{reUotarget}+$
  $\text{imUAtarget}*BB*\text{reUBtarget}+$
  $\text{imUAtarget}*\text{Gcoil\_eq\_res}*\text{imUotarget})/(-$
  $\text{reUAtarget}*\text{imUBtarget}+$
  $\text{imUAtarget}*\text{reUBtarget})$ Eq. 6c In case control admittances with susceptances $B_{xB}$, $B_{xC}$ are to be added into phases B and C, the following can be written:

$$\overline{Y}_A \cdot \overline{U}_{A\_target} + (\overline{Y}_B + j \cdot B_{xB}) \cdot \overline{U}_{B\_target} + (\overline{Y}_C + j \cdot B_{xC}) \cdot \overline{U}_{C\_target} = -\overline{Y}_{coil\_eq\_res} \cdot \overline{U}_{o\_target} \quad \text{Eq. 7a}$$

By dividing the equation into real and imaginary parts, susceptances $B_{xB}$ and $B_{xC}$ can be solved as:

$B_{xB}=-(-GC*\text{imUCtarget}^2-$
  $BB*\text{reUBtarget}*\text{imUCtarget}-$
  $\text{reUCtarget}*GB*\text{reUBtarget}-GC*\text{reUCtarget}^2-$
  $GB*\text{imUBtarget}*\text{imUCtarget}-$
  $GA*\text{imUAtarget}*\text{imUCtarget}+$
  $\text{Bcoil\_eq\_res}*\text{reUotarget}*\text{imUCtarget}+$
  $BB*\text{reUCtarget}*\text{imUBtarget}-$
  $\text{reUCtarget}*GA*\text{reUAtarget}-$
  $\text{reUCtarget}*\text{Gcoil\_eq\_res}*\text{reUotarget}+$
  $\text{reUCtarget}*BA*\text{imUAtarget}-$
  $\text{reUCtarget}*\text{Bcoil\_eq\_res}*\text{imUotarget}-$
  $\text{Gcoil\_eq\_res}*\text{imUotarget}*\text{imUCtarget}-$
  $BA*\text{reUAtarget}*\text{imUCtarget})/(-$
  $\text{reUBtarget}*\text{imUCtarget}+$
  $\text{reUCtarget}*\text{imUBtarget})$ Eq. 7b $B_{xC}=(-BA*\text{reUAtarget}*\text{imUBtarget}-$
  $GB*\text{imUBtarget}^2-\text{reUBtarget}*GA*\text{reUAtarget}-$
  $GB*\text{reUBtarget}^2-$
  $\text{reUBtarget}*\text{Gcoil\_eqres}*\text{reUotarget}-$
  $\text{Gcoil\_eq\_res}*\text{imUotarget}*\text{imUBtarget}+$
  $\text{Bcoil\_eq\_res}*\text{reUotarget}*\text{imUBtarget}+$
  $BA*\text{imUAtarget}*\text{reUBtarget}-$
  $GA*\text{imUAtarget}*\text{imUBtarget}-$
  $BC*\text{reUCtarget}*\text{imUBtarget}-$
  $GC*\text{imUCtarget}*\text{imUBtarget}-$
  $\text{reUBtarget}*\text{Bcoil\_eq\_res}*\text{imUotarget}-$
  $\text{reUBtarget}*GC*\text{reUCtarget}+$
  $\text{reUBtarget}*BC*\text{imUCtarget})/(-$
  $\text{reUBtarget}*\text{imUCtarget}+$
  $\text{reUCtarget}*\text{imUBtarget})$ Eq. 7c In case control admittances with susceptances $B_{xC}$, $B_{xA}$ are to be added into phases C and A, the following can be written:

$$(\overline{Y}_A + j \cdot B_{xA}) \cdot \overline{U}_{A\_target} + \overline{Y}_B \cdot \overline{U}_{B\_target} + (\overline{Y}_C + j \cdot B_{xC}) \cdot \overline{U}_{C\_target} = -\overline{Y}_{coil\_eq\_res} \cdot \overline{U}_{o\_target} \quad \text{Eq. 8a}$$

By dividing the equation into real and imaginary parts, susceptances $B_{xC}$ and $B_{xA}$ can be solved as:

$B_{xC}=-(GA*\text{reUAtarget}^2+$
  $\text{reUAtarget}*GB*\text{reUBtarget}-$
  $\text{reUAtarget}*BB*\text{imUBtarget}+$
  $\text{reUAtarget}*\text{Bcoil\_eq\_res}*\text{imUotarget}+$
  $\text{reUAtarget}*GC*\text{reUCtarget}-$
  $\text{reUAtarget}*BC*\text{imUCtarget}+$
  $\text{reUAtarget}*\text{Gcoil\_eq\_res}*\text{reUotarget}+$
  $\text{imUAtarget}*GC*\text{imUCtarget}+$
  $\text{imUAtarget}*GB*\text{imUBtarget}+$
  $GA*\text{imUAtarget}^2+$
  $\text{imUAtarget}*BC*\text{reUCtarget}-$
  $\text{imUAtarget}*\text{Bcoil\_eq\_res}*\text{reUotarget}+$
  $\text{imUAtarget}*BB*\text{reUBtarget}+$
  $\text{imUAtarget}*\text{Gcoil\_eq\_res}*\text{imUotarget})/(-$
  $\text{reUAtarget}*\text{imUCtarget}+$
  $\text{imUAtarget}*\text{reUCtarget})$ Eq. 8b $B_{xA}=-(-GC*\text{imUCtarget}^2-$
  $BB*\text{reUBtarget}*\text{imUCtarget}-$
  $\text{reUCtarget}*GB*\text{reUBtarget}-GC*\text{reUCtarget}^2-$
  $GB*\text{imUBtarget}*\text{imUCtarget}-$
  $GA*\text{imUAtarget}*\text{imUCtarget}+$
  $\text{Bcoil\_eq\_res}*\text{reUotarget}*\text{imUCtarget}+$
  $BB*\text{reUCtarget}*\text{imUBtarget}-$
  $\text{reUCtarget}*GA*\text{reUAtarget}-$
  $\text{reUCtarget}*\text{Gcoil\_eq\_res}*\text{reUotarget}+$
  $\text{reUCtarget}*BA*\text{imUAtarget}-$
  $\text{reUCtarget}*\text{Bcoil\_eq\_res}*\text{imUotarget}-$
  $\text{Gcoil\_eq\_res}*\text{imUotarget}*\text{imUCtarget}-$
  $BA*\text{reUAtarget}*\text{imUCtarget})/(-$
  $\text{reUAtarget}*\text{imUCtarget}+$
  $\text{imUAtarget}*\text{reUCtarget})$ Eq. 8c where $\text{reUAtarget}=\text{Re}(\overline{U}_{A\_target})$, $\text{imUAtarget}=\text{Im}(\overline{U}_{A\_target})$, $\text{reUBtarget}=\text{Re}(\overline{U}_{B\_target})$, $\text{imUBtarget}=\text{Im}(\overline{U}_{B\_target})$, $\text{reUCtarget}=\text{Re}(\overline{U}_{C\_target})$, $\text{imUCtarget}=\text{Im}(\overline{U}_{C\_target})$, reUotarget=Re($\overline{U}_{o\_target}$), imUotarget=Im($\overline{U}_{o\_target}$), $GA$=Re($\overline{Y}_A$), $BA$=Im($\overline{Y}_A$), $GB$=Re($\overline{Y}_B$), $BB$=Im($\overline{Y}_B$), $GC$=Re($\overline{Y}_C$), $BC$=Im($\overline{Y}_C$), and where $G_{coil\_eq\_res}$ and $B_{coil\_eq\_res}$ can be obtained from Eq. 1r and Eq. 1s,
and $\overline{U}_{A\_target}$, $\overline{U}_{B\_target}$, $\overline{U}_{C\_target}$ can be obtained from Eq. 5a, 5b, and 5c, respectively.

In the solutions, a positive value of susceptance equals a capacitive element, a negative value of susceptance equals an inductive element.

After the two phase-specific control admittances are calculated 120, the calculated, phase-specific control admittances may be added 130 between the ground and the respective phase of the three-phase resonant-earthed electric network 20 e.g. by suitable admittance control means as described earlier with reference to exemplary FIG. 3.

The target value for the neutral point voltage $\overline{U}_{o\_target}$ may be reached at the resonance point valid in the network prior to the adding 130 of the phase-specific control admittances. The target value for the neutral point voltage $\overline{U}_{o\_target}$ may be equally reached after the adding 130 of the phase-specific control admittances at detuning degree corresponding to the sum of imaginary parts of the inserted phase-specific control admittances. In case the sum of imaginary parts of added control admittances is capacitive, then detuning degree is undercompensated.

According to an embodiment, the solution for the control admittance can be affected by varying the phase angle (phi) of the target neutral point voltage $\overline{U}_{o\_target}$=reUotarget+j·imUotarget=$U_{o\_target}$·(cos(phi)+j·sin(phi)) between 0-360 deg. An optimal solution can be selected according to the phase angle of $\overline{U}_{o\_target}$ which provides control admittances to be added so that:

a) The phase-wise added control admittances with susceptances are as small as possible. This is to minimize physical size and cost, and b) The imaginary parts of the phase-wise added control admittances with susceptances:
are either both positive (capacitive) or negative (inductive). This would simplify the implementation, or
have opposite signs and their magnitudes are as equal as possible. This would minimize the impact on the total network admittance value.

An advantage of adding control admittances with essentially zero conductance, i.e. essentially pure susceptances, in pairs compared with a phase-wise added admittance is that an addition of a resistive element and thus addition of system losses may be avoided.

Fourth Exemplary Embodiment

According to an embodiment, the calculating 120 comprises calculating the neutral point specific control admittance based on total phase-to-earth admittances for each phase of the three-phase resonant-earthed electric network, a coil admittance of an arc suppression coil of the three-phase resonant-earthed electric network at a resonance of the three-phase resonant-earthed electric network, a source phase-to-earth voltage magnitude of the three-phase resonant-earthed electric network, and the determined target value for the neutral point voltage of the three-phase resonant-earthed electric network. According to an embodiment, the total phase-to-earth admittances for each phase of the three-phase resonant-earthed electric network are determined based on three different values of the coil admittance of the arc suppression coil of the three-phase resonant-earthed electric network, and respective three values of a zero-sequence voltage and of phase voltages of the three-phase resonant-earthed electric network. In the following, respective examples of the calculating of the neutral point-specific control admittance are disclosed. In the examples the coil admittance has been expressed by means of the equivalent coil admittance based on Eq. 1c.

According to an embodiment, the neutral point voltage Uo may be manipulated, e.g. decreased from any prevailing level to a pre-defined level, by connecting a control admittance $\overline{Y}_{xN}$ into a system neutral point. The total phase to earth admittances $\overline{Y}_A$, $\overline{Y}_B$, $\overline{Y}_C$ for each phase A, B and C can be solved based on Equations 3d-3f.

In case control admittance $\overline{Y}_{xN}$ is to be added into the system neutral point, the following can be written:

$$\overline{Y}_A \cdot \overline{U}_{A\_target} + \overline{Y}_B \cdot \overline{U}_{B\_target} + \overline{Y}_C \cdot \overline{U}_{C\_target} = -(\overline{Y}_{coil\_eq\_res} + \overline{Y}_{xN}) \cdot \overline{U}_{o\_target} \quad \text{Eq. 9a}$$

Utilizing equations 5a-5c, Eq. 9a can be written as:

$$\overline{Y}_A \cdot (U_{PE} + \overline{U}_{o\_target}) + \overline{Y}_B \cdot (\overline{a}^2 \cdot U_{PE} + \overline{U}_{o\_target}) + \overline{Y}_C \cdot (\overline{a} \cdot U_{PE} + \overline{U}_{o\_target}) = -(\overline{Y}_{coil\_eq\_res} + \overline{Y}_{xN}) \cdot \overline{U}_{o\_target} \quad \text{Eq. 9b}$$

From equation Eq. 9b admittance $Y_{xN}$ can be solved as:

$$\overline{Y}_{xN} = -(\overline{Y}_A + \overline{Y}_B + \overline{Y}_C + \overline{Y}_{coil\_eq\_res}) - (\overline{Y}_A + \overline{a}^2 \cdot \overline{Y}_B + \overline{a} \cdot \overline{Y}_C) \cdot U_{PE}/\overline{U}_{o\_target} \quad \text{Eq. 9c}$$

Equation Eq. 9c can further be written as:

$$\overline{Y}_{xN} = -(\overline{Y}_{net} + \overline{Y}_{coil\_eq\_res}) - \overline{Y}_{asymm} \cdot U_{PE}/\overline{U}_{o\_target} \quad \text{Eq. 9d}$$

where $\overline{Y}_{coil\_eq\_res} = G_{coil\_eq\_res} - j \cdot B_{coil\_eq\_res}$ and where $G_{coil\_eq\_res}$ and $B_{coil\_eq\_res}$ can be determined according to Eq. 1r and Eq. 1s.

The target value for the neutral point voltage $\overline{U}_{o\_target}$ may be reached at the resonance point valid in the network prior to the adding 130 of the control admittance to the system neutral point. The target value for the neutral point voltage $\overline{U}_{o\_target}$ may be equally reached after the adding 130 of the control admittance at detuning degree corresponding to the imaginary part of the inserted control admittance. In case the imaginary part of added control admittance is capacitive, then detuning degree is undercompensated.

According to an embodiment, the solution can be affected by varying the phase angle (phi) of the target neutral point voltage $\overline{U}_{o\_target}$=reUotarget+j·imUotarget= $U_{o\_target}$·(cos(phi)+j·sin(phi)) between 0-360 deg.

As the phase angle of the target neutral point voltage $\overline{U}_{o\_target}$ can be any value and only the magnitude is meaningful, the control admittance should preferably be selected so that that the solution has only conductance, i.e. the imaginary part of the control admittance is zero. This can be achieved by selecting the solution according to the phase angle of $\overline{U}_{o\_target}$ which provides a control admittance consisting only of the conductance part (imaginary part becomes zero or close to zero). Only a positive value of conductance $G_{xN}$ is physically feasible.

Generally, the required control admittance with conductance $G_{xN}$ to be connected to the system neutral point may be much larger compared with admittances connected into phases. Thus, this embodiment may be preferable e.g. when fine tuning of the neutral point voltage at resonance is required.

After the neutral point specific control admittance is calculated 120, the calculated neutral point specific control admittance is added 130, e.g. by suitable admittance control means connected to the three-phase resonant-earthed electric network 20, between the ground and the neutral point of the three-phase resonant-earthed electric network 20.

Figure 4:
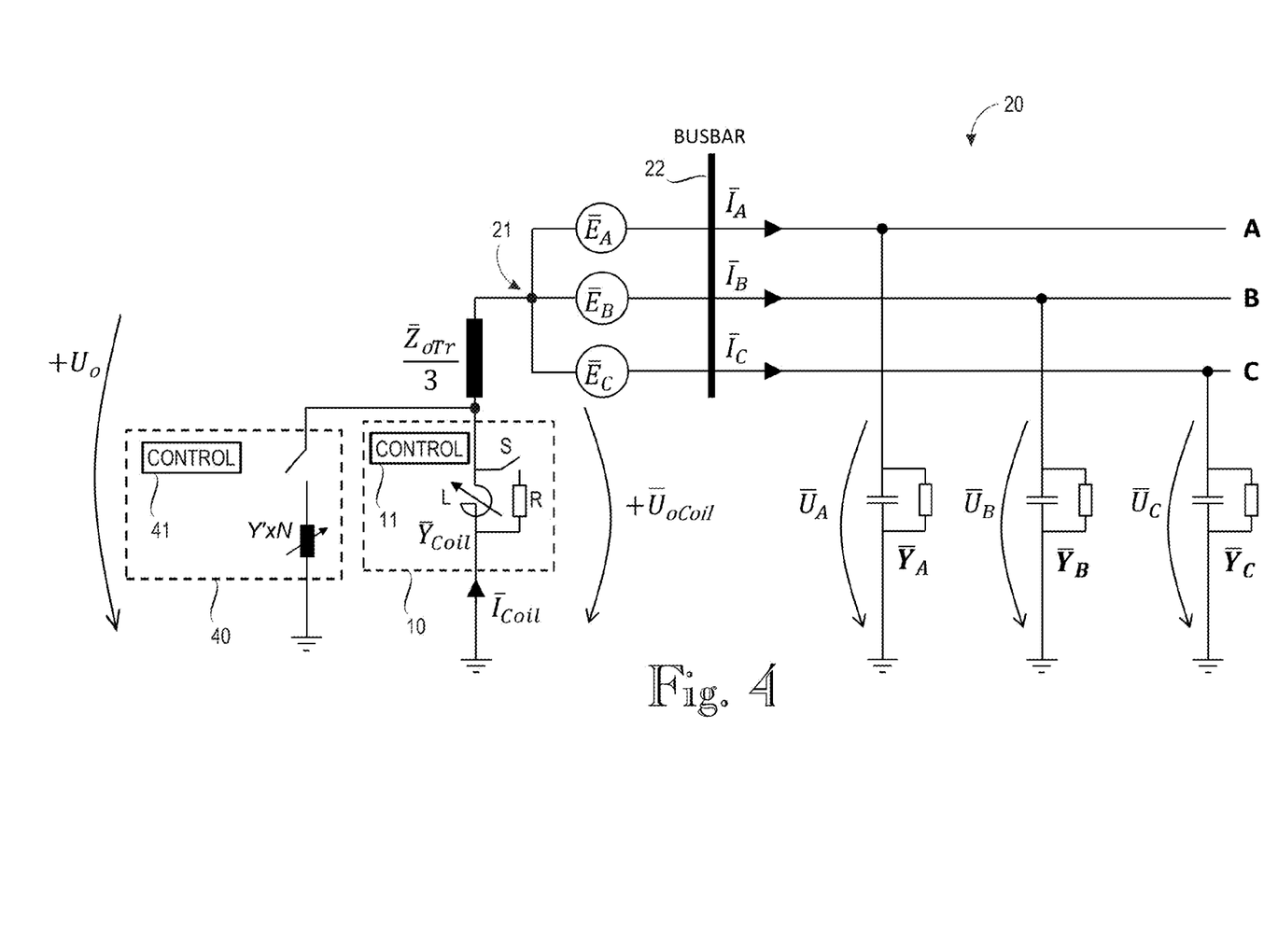
FIG. 4 shows an example of a three-phase electric network according to an embodiment.

FIG. 4 illustrates a three-phase electric network 20 corresponding to that shown also in FIG. 1. The exemplary three-phase network 20 shown in FIG. 4 is equipped with an arc suppression device 10 which is provided with a control arrangement 11, as described earlier with reference to FIG. 3. Also in the exemplary system of FIG. 4, at least part of the functionality of the various embodiments may be provided by means of the control arrangement 11 of the arc suppression device 10, for example. The exemplary three-phase network 20 shown in FIG. 4 is further equipped with an admittance control arrangement 40 with which a neutral point specific control admittance $Y_{xN}$ can be added between the ground and the neutral point 21 of the three-phase electric network 20. The admittance of the admittance control arrangement 40 itself is denoted as $Y'_{xN}$.

In practice the admittance control arrangement 40, with which the required control admittance $Y_{xN}$ may be provided, can be connected in parallel with the arc suppression device 10, for example, as shown in the example of FIG. 4. In the example of FIG. 4, in order to take into account the effect of the zero-sequence impedance of the earthing or main transformer, $\overline{Z}_{oTr}$, via which the control arrangement 40 is connected to the network, the value for the admittance $Y'_{xN}$ of the admittance control arrangement 40 itself may then be calculated on the basis of the determined value for the neutral point specific control admittance $Y_{xN}$ as follows:

$$\overline{Y}'_{xN} = -\frac{\overline{Y}_{xN} \cdot (1 + 2 \cdot \overline{Z}_{oTr} \cdot \overline{Y}_{coil} + \overline{Z}^2_{oTr} \cdot \overline{Y}^2_{coil})}{\overline{Y}_{xN} \cdot \overline{Z}_{oTr} + \overline{Y}_{xN} \cdot \overline{Z}^2_{oTr} \cdot \overline{Y}_{coil} - 1} = G'_{xN} + j \cdot B'_{xN} \qquad \text{Eq. 10}$$

In case $\overline{Z}_{oTr}=0$ ohm, then $\overline{Y}'_{xN}=\overline{Y}_{xN}$

The admittance control arrangement 40 may comprise one or more components, such as e.g. resistor(s), and/or capacitors and/or inductors, capable of providing the desired admittance. Such components may be adjustable and/or connectable in series and/or in parallel in suitable manner to adjust the total admittance provided by the arrangement. The admittance control arrangement 40 may also comprise suitable switching means such as one or more controllable electromechanical switches and/or one or more semiconductor switches enabling the switching of the admittance providing component(s). The admittance control arrangement 40 could also be implemented by means of a static synchronous compensator, i.e. STATCOM, device or a similar power electronics device, which is able to provide the desired control admittance to be added in an equivalent way, for example. The exemplary admittance control arrangement 40 is provided with a control arrangement 41, such as a controller device or a control unit. Such a control arrangement 41 could be a separate entity as illustrated in the example or integrated with the control arrangement 11 of the arc suppression device 10, for example. In the exemplary system of FIG. 4, at least part of the functionality of the various embodiments may be provided by means of the control arrangement 41 of the admittance control arrangement 40, for example. The control arrangement 41 may be configured to calculate and adjust the value of the neutral point specific control admittance with conductance $G_x$ and to add (and remove), i.e. connect (and disconnect), the neutral point specific control admittance between the ground and the neutral point of the three-phase electric network 20, for instance.

An apparatus according to any one of the above embodiments, or a combination thereof, may be implemented as a single unit or as two or more units that are configured to implement the functionality of the various embodiments. Here the term 'unit' refers generally to a physical or logical entity, such as a physical device or a part thereof or a software routine. One or more of these units may reside in the control arrangements 11, 31, 41, for example.

An apparatus for implementing the functionality according to any one of the embodiments may be implemented at least partly by means of one or more computers or corresponding digital signal processing (DSP) equipment provided with suitable software, for example. Such a computer or digital signal processing equipment preferably comprises at least a working memory (RAM) providing storage area for arithmetical operations, and a central processing unit (CPU), such as a general-purpose digital signal processor. The CPU may comprise a set of registers, an arithmetic logic unit, and a control unit. The CPU control unit is controlled by a sequence of program instructions transferred to the CPU from the RAM. The CPU control unit may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The computer may also have an operating system which may provide system services to a computer program written with the program instructions. The computer or other apparatus implementing the invention, or a part thereof, may further comprise suitable input means for receiving e.g. measurement and/or control data, and output means for outputting e.g. control or other data. It is also possible to use a specific integrated circuit or circuits, or discrete electric components and devices for implementing the functionality according to any one of the embodiments.

The invention can be implemented at least partly in existing system elements, such as various arc suppression devices or similar devices, and/or by using separate dedicated elements or devices in a centralized or distributed manner. Present arc suppression devices for electric networks may comprise processors and memory that may be utilized in the functions according to the various embodiments described herein. Thus, all modifications and configurations required for implementing an embodiment in existing electric system components, may be performed as software routines, which may be implemented as added or updated software routines. If at least part of the functionality of the invention is implemented by software, such software may be provided as a computer program product comprising computer program code which, when run on a computer, causes the computer or corresponding arrangement to perform the functionality according to the embodiments as described herein. Such a computer program code may be stored or generally embodied on a computer readable medium, such as suitable memory, e.g. a flash memory or an optical memory, from which it is loadable to the unit or units executing the program code. In addition, such a computer program code implementing the invention may be loaded to the unit or units executing the computer program code via a suitable data network, for example, and it may replace or update a possibly existing program code.

It will be obvious to a person skilled in the art that, as the technology advances, the inventive concept can be implemented in various ways. The invention and its embodiments are not limited to the examples described above but may vary within the scope of the claims.

The invention claimed is:

1. A method for controlling a neutral point voltage of a three-phase resonant-earthed electric network, the method comprising:
   determining a target value for the neutral point voltage of the three-phase resonant-earthed electric network;
   calculating at least one phase-specific control admittance or a neutral point specific control admittance required for controlling the neutral point voltage of the three-phase resonant-earthed electric network from a prevailing value to the determined target value; and
   adding the calculated at least one phase-specific control admittance between a ground and a respective phase of the three-phase resonant-earthed electric network or the calculated neutral point specific control admittance between the ground and a neutral point of the three-phase resonant-earthed electric network.

2. The method of claim 1, wherein the step of calculating comprises calculating one phase-specific control admittance based on a total damping of the three-phase resonant-earthed electric network, the determined target value for the neutral point voltage of the three-phase resonant-earthed electric network, and a source phase voltage magnitude of the three-phase resonant-earthed electric network.

3. The method of claim 2, wherein the determined target value of the neutral point voltage of the three-phase resonant-earthed electric network is higher than the prevailing value of the neutral point voltage of the three-phase resonant-earthed electric network.

4. The method of claim 3, wherein the prevailing value of the neutral point voltage of the three-phase resonant-earthed electric network is essentially zero.

5. The method of claim 1, wherein the step of calculating comprises calculating the neutral point specific control admittance based on total phase-to-earth admittances for each phase of the three-phase resonant-earthed electric network, a coil admittance of an arc suppression coil of the three-phase resonant-earthed electric network at a resonance of the three-phase resonant-earthed electric network, a source phase-to-earth voltage magnitude of the three-phase resonant-earthed electric network, and the determined target value for the neutral point voltage of the three-phase resonant-earthed electric network.

6. The method of claim 1, wherein the step of calculating comprises calculating one phase-specific control admittance based on total phase-to-earth admittances for each phase of the three-phase resonant-earthed electric network, a coil admittance of an arc suppression coil of the three-phase resonant-earthed electric network at a resonance of the three-phase resonant-earthed electric network, a source phase-to-earth voltage magnitude of the three-phase resonant-earthed electric network, and the determined target value for the neutral point voltage of the three-phase resonant-earthed electric network.

7. The method of claim 6, wherein the step of calculating comprises varying a phase angle of the determined target value for the neutral point voltage of the three-phase resonant-earthed electric network to obtain the at least one phase-specific control admittance such that one or more predetermined conditions are fulfilled.

8. The method of claim 6, wherein the total phase-to-earth admittances for each phase of the three-phase resonant-earthed electric network are determined based on three different values of the coil admittance of the arc suppression coil of the three-phase resonant-earthed electric network, and respective three values of a zero-sequence voltage and of phase voltages of the three-phase resonant-earthed electric network.

9. The method of claim 1, wherein the step of calculating comprises calculating two phase-specific control admittances based on total phase-to-earth admittances for each phase of the three-phase resonant-earthed electric network, a coil admittance of an arc suppression coil of the three-phase resonant-earthed electric network at a resonance of the three-phase resonant-earthed electric network, a source phase-to-earth voltage magnitude of the three-phase resonant-earthed electric network, and the determined target value for the neutral point voltage of the three-phase resonant-earthed electric network.

10. The method of claim 9, wherein the two phase-specific control admittances are essentially pure susceptances.

11. The method of claim 1, wherein the determined target value for the neutral point voltage of the three-phase resonant-earthed electric network is valid at a resonance of the three-phase resonant-earthed electric network.

12. An apparatus for controlling a neutral point voltage of a three-phase resonant-earthed electric network, the apparatus comprising:
    a controller configured to determine a target value for the neutral point voltage of the three-phase resonant-earthed electric network;
    calculating means configured to calculate at least one phase-specific control admittance or a neutral point specific control admittance required for controlling the neutral point voltage of the three-phase resonant-earthed electric network from a prevailing value to the determined target value; and
    admittance means configured to add the calculated at least one phase-specific control admittance between a ground and a respective phase of the three-phase resonant-earthed electric network or the calculated neutral point specific control admittance between the ground and a neutral point of the three-phase resonant-earthed electric network.

13. The apparatus of claim 12, wherein the calculating means are configured to calculate one phase-specific control admittance based on a total damping of the three-phase resonant-earthed electric network, the determined target value for the neutral point voltage of the three-phase resonant-earthed electric network, and a source phase voltage magnitude of the three-phase resonant-earthed electric network.

14. The apparatus of claim 12, wherein the calculating means are configured to calculate one phase-specific control admittance based on total phase-to-earth admittances for each phase of the three-phase resonant-earthed electric network, a coil admittance of an arc suppression coil of the three-phase resonant-earthed electric network at a resonance of the three-phase resonant-earthed electric network, a source phase-to-earth voltage magnitude of the three-phase resonant-earthed electric network, and the determined target value for the neutral point voltage of the three-phase resonant-earthed electric network.

15. The apparatus of claim 14, wherein the calculating means are configured to vary a phase angle of the determined target value for the neutral point voltage of the three-phase resonant-earthed electric network to obtain the at least one phase-specific control admittance such that one or more predetermined conditions are fulfilled.

16. The apparatus of claim 14, wherein the calculating means are configured to calculate the total phase-to-earth admittances for each phase of the three-phase resonant-earthed electric network based on three different values of the coil admittance of the arc suppression coil of the three-phase resonant-earthed electric network, and respective three values of a zero-sequence voltage and of phase voltages of the three-phase resonant-earthed electric network.

17. The apparatus of claim 12, wherein the calculating means are configured to calculate two phase-specific control admittances based on total phase-to-earth admittances for each phase of the three-phase resonant-earthed electric network, a coil admittance of an arc suppression coil of the three-phase resonant-earthed electric network at a resonance of the three-phase resonant-earthed electric network, a source phase-to-earth voltage magnitude of the three-phase resonant-earthed electric network, and the determined target value for the neutral point voltage of the three-phase resonant-earthed electric network.

18. The apparatus of claim 12, wherein the calculating means are configured to calculate the neutral point specific control admittance based on total phase-to-earth admittances for each phase of the three-phase resonant-earthed electric network, a coil admittance of an arc suppression coil of the three-phase resonant-earthed electric network at a resonance of the three-phase resonant-earthed electric network, a source phase-to-earth voltage magnitude of the three-phase resonant-earthed electric network, and the determined target value for the neutral point voltage of the three-phase resonant-earthed electric network.

19. The apparatus of claim 12, wherein the admittance means comprises one or more capacitive, inductive and/or resistive elements configured to be connected to the three-phase resonant-earthed electric network.

20. An apparatus for controlling a neutral point voltage of a three-phase resonant-earthed electric network, the apparatus comprising a control arrangement including a processor, and a memory storing instructions that, when executed by the processor, cause the control arrangement to:
  determine a target value for the neutral point voltage of the three-phase resonant-earthed electric network;
  calculate at least one phase-specific control admittance or a neutral point specific control admittance required for controlling the neutral point voltage of the three-phase resonant-earthed electric network from a prevailing value to the determined target value; and
  control an admittance control arrangement to add the calculated at least one phase-specific control admittance between a ground and a respective phase of the three-phase resonant-earthed electric network or the calculated neutral point specific control admittance between the ground and a neutral point of the three-phase resonant-earthed electric network.

21. The apparatus of claim 20, wherein the admittance control arrangement comprises one or more capacitive, inductive and/or resistive elements configured to be connected to the three-phase resonant-earthed electric network.

* * * * *